United States Patent
Meyer et al.

(10) Patent No.: US 10,249,787 B2
(45) Date of Patent: Apr. 2, 2019

(54) COMPONENT HAVING A MULTIPLE QUANTUM WELL STRUCTURE

(71) Applicant: OSRAM Opto Semiconductors GmbH, Regensburg (DE)

(72) Inventors: Tobias Meyer, Regensburg (DE); Thomas Lehnhardt, Regensburg (DE); Matthias Peter, Regensburg (DE); Asako Hirai, Regensburg (DE); Juergen Off, Regensburg (DE); Philipp Drechsel, Regensburg (DE); Peter Stauss, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/559,409

(22) PCT Filed: Mar. 1, 2016

(86) PCT No.: PCT/EP2016/054312
§ 371 (c)(1),
(2) Date: Sep. 18, 2017

(87) PCT Pub. No.: WO2016/146376
PCT Pub. Date: Sep. 22, 2016

(65) Prior Publication Data
US 2018/0083160 A1    Mar. 22, 2018

(30) Foreign Application Priority Data
Mar. 19, 2015   (DE) .................. 10 2015 104 150

(51) Int. Cl.
*H01S 5/22* (2006.01)
*H01S 5/30* (2006.01)
(Continued)

(52) U.S. Cl.
CPC ............ *H01L 33/06* (2013.01); *H01S 5/2228* (2013.01); *H01S 5/309* (2013.01); *H01S 5/3216* (2013.01);
(Continued)

(58) Field of Classification Search
CPC ..... H01L 33/06; H01L 33/24; H01L 33/0025; H01L 33/0075; H01S 5/2228; H01S 5/309; H01S 5/3216; H01S 5/34
(Continued)

(56) References Cited

U.S. PATENT DOCUMENTS 7,611,917 B2   11/2009   Emerson et al.
2010/0155704 A1   6/2010   Oh et al.
(Continued)

FOREIGN PATENT DOCUMENTS

DE   112006001084 T5   5/2008
DE   102012104671 A1   12/2013
(Continued)

OTHER PUBLICATIONS

Hangleiter et al.: "Suppression of Nonradiative Recombination by V-Shaped Pits in GaInN/GaN Quantum Wells Produces a Large Increase in the Light Emission Efficiency" Physical Review Letters PRL 95 127402 (2005) Sep. 16, 2005, p. 1-4.

*Primary Examiner* — Didarul A Mazumder
*Assistant Examiner* — Patricia D Reddington
(74) *Attorney, Agent, or Firm* — McDermott Will & Emery LLP (57) ABSTRACT

The invention relates to a component (10) having a semiconductor layer sequence, which has a p-conducting semiconductor layer (1), an n-conducting semiconductor layer (2), and an active zone (3) arranged between the p-conducting semiconductor layer and the n-conducting semiconductor layer, wherein the active zone has a multiple quantum
(Continued)

well structure, which, from the p-conducting semiconductor layer to the n-conducting semiconductor layer, has a plurality of p-side barrier layers (32p) having intermediate quantum well layers (31) and a plurality of n-side barrier layers (32n) having intermediate quantum layers (31). Recesses (4) having flanks are formed in the semiconductor layer sequence on the part of the p-conducting semiconductor layer, wherein the quantum well layers and/or the n- and p-side barrier layers extend in a manner conforming to the flanks of the recesses at least in regions. The interior barrier layers have a larger average layer thickness than the p-side barrier layers.

18 Claims, 3 Drawing Sheets

(51) Int. Cl.
| | | |
|---|---|---|
| *H01S 5/32* | (2006.01) | |
| *H01L 33/06* | (2010.01) | |
| *H01S 5/34* | (2006.01) | |
| *H01L 33/24* | (2010.01) | |
| *H01L 33/00* | (2010.01) | |
| *H01L 33/32* | (2010.01) | |

(52) U.S. Cl.
CPC ............ *H01S 5/34* (2013.01); *H01L 33/0025* (2013.01); *H01L 33/0075* (2013.01); *H01L 33/24* (2013.01); *H01L 33/32* (2013.01)

(58) Field of Classification Search
USPC .......................................................... 257/14
See application file for complete search history.

(56) References Cited

U.S. PATENT DOCUMENTS

| | | | | |
|---|---|---|---|---|
| 2011/0309327 | A1* | 12/2011 | Jeong | ...................... H01L 33/32 |
| | | | | 257/13 |
| 2012/0013273 | A1* | 1/2012 | Ren | ........................ C30B 25/00 |
| | | | | 315/363 |
| 2012/0248407 | A1* | 10/2012 | Toyoda | ................... H01L 33/06 |
| | | | | 257/13 |
| 2013/0003779 | A1 | 1/2013 | Fukuda et al. | |
| 2013/0069033 | A1 | 3/2013 | Kushibe et al. | |
| 2014/0077152 | A1 | 3/2014 | Li et al. | |
| 2014/0332756 | A1 | 11/2014 | Kashihara et al. | |
| 2015/0060762 | A1 | 3/2015 | Kim et al. | |
| 2015/0083993 | A1* | 3/2015 | Nagata | ................... H01L 33/06 |
| | | | | 257/13 |
| 2015/0171263 | A1* | 6/2015 | Nakatsu | ................ H01L 33/007 |
| | | | | 257/13 |

FOREIGN PATENT DOCUMENTS

| | | |
|---|---|---|
| DE | 102012217640 A1 | 4/2014 |
| JP | 2008218746 A | 9/2008 |
| WO | 2013187171 A1 | 12/2013 |

\* cited by examiner

COMPONENT HAVING A MULTIPLE QUANTUM WELL STRUCTURE

The present application relates to a component having a multiple quantum well structure.

In optoelectronic components which are based on semiconductor materials and comprise an active zone with a multiple quantum well structure, the problem arises that charge carriers in the active zone are not distributed uniformly over the multiple quantum well structure, resulting in losses in efficiency for such optoelectronic components.

One object is to provide a high efficiency component.

According to at least one embodiment of a component, the component comprises an active zone which contains a multiple quantum well structure provided for generating electromagnetic radiation. The active zone is in particular a sub-region of an in particular epitaxially grown semiconductor layer sequence of the component. The active zone is for example arranged between a first, for instance p-conductive semiconductor layer, and a second, for instance n-conductive semiconductor layer. The component may be a light-emitting diode chip or a laser diode chip. The active zone is for example based on a III-V compound semiconductor material.

The multiple quantum well structure may comprise a plurality of successive quantum well layers and barrier layers. In particular, in each case one quantum well layer and one barrier layer succeed one another in the active zone.

The barrier layers are understood to be layers of the multiple quantum well structure which are each arranged between two quantum well layers of the multiple quantum well structure and for instance adjoin these quantum well layers associated therewith. That is to say, a barrier layer is in particular always arranged between two quantum well layers associated therewith. The peripheral layers of the multiple quantum well structure, which for instance adjoin the first or second semiconductor layer, are terminating barriers of the multiple quantum well structure and are not to be understood as barrier layers. A peripheral quantum well layer may therefore be arranged between a barrier layer and a terminating barrier.

The terms "multiple quantum well structure" and "quantum well layer" do not here have any significance regarding quantization dimensions. The quantum well structure defined by a quantum well layer and the two barrier layers associated therewith may comprise a quantum film, at least one quantum wire, a quantum well or at least one quantum dot or a combination of these structures. A barrier layer is understood in particular to mean a semiconductor layer of the active zone adjacent to a quantum well layer.

According to at least one embodiment of the component, the active zone comprises a recess open towards the first semiconductor layer. The recess is thus formed in the semiconductor layer sequence. The quantum well layers and/or the barrier layers may in this case follow the shape of the recess at least in places. That is to say, the quantum well layers and/or the barrier layers may at least in places extend conformally with the sidewalls of the recess. The component may comprise a plurality of such recesses. The recess may in this respect have a vertical depth which is in particular greater, for instance at least twice, for example three times or five times as great as the vertical layer thickness of a p-side barrier layer. The first, in particular p-conductive semiconductor layer may extend into the recess, whereby the positively charged charge carriers, namely the holes, may be simply and effectively injected into different quantum well layers for instance via sidewalls of the recess. The recess may in this case be sufficiently deep for all the quantum well layers and barrier layers on the p-side of the active zone to extend conformally with the sidewalls of the recess or recesses at least in places. The n-side barrier layers likewise preferably extend at least in places conformally with the sidewalls of the recess or recesses.

A vertical direction is understood to mean a direction which is directed in particular perpendicular to a main area of extension of the active zone. The vertical direction is in particular parallel to a direction of growth of the epitaxial semiconductor layer sequence of the component. A lateral direction is understood to mean a direction which extends in particular parallel to the main area of the extension of the active zone.

Due to the recess or recesses, charge carriers from the first semiconductor layer, for example the comparatively poorly mobile positive charge carriers (holes), are effectively injected within the recess, for instance at obliquely configured sidewalls of the recess, into different quantum well layers, whereby an imbalance is reduced in the quantum well layers between the comparatively poorly mobile holes and more readily mobile, negatively charged charge carriers (electrons) injected for instance from the second semiconductor layer into the quantum well layers. In other words, the quantum well layers located further from the first semiconductor layer may be better energized due to the recess or recesses.

According to at least one configuration of the semiconductor layer sequence, the barrier layers are classified as n-side barrier layers and p-side barrier layers, wherein the p-side barrier layers are arranged between the n-side barrier layers and the p-conductive semiconductor layer and thus on a p-side of the active zone. The n-side barrier layers are accordingly arranged between the p-side barrier layers and the n-conductive semiconductor layer and thus on an n-side of the active zone.

According to at least one configuration of the active zone, between one tenth and one third or one half inclusive of the total barrier layers are arranged on the n-side or on the p-side of the active zone. For example, at least one third to half or two thirds of the total barrier layers are classified as p-side barrier layers, wherein the remaining barrier layers are arranged between the p-side barrier layers and the n-conductive semiconductor layer and are thus n-side barrier layers.

According to at least one embodiment of the component, the n-side barrier layers have an average layer thickness which is greater than an average layer thickness of the p-side barrier layers. That is to say, the vertical layer thicknesses of the p-side barrier layers in particular outside the recess or outside the recesses are on average smaller than the vertical layer thicknesses of the n-side barrier layers. The smaller layer thicknesses of the p-side barrier layers promote injection of the poorly mobile holes into the quantum well layers, so improving uniformity of current distribution within the active zone. The average layer thickness of the n-side barrier layers is for example at least 1.2 times, for instance at least 1.5 times, in particular at least 2 or 5 times the average layer thickness of the p-side barrier layers. The average layer thickness of the n-side barrier layers may in this respect be at most ten times greater than the average layer thickness of the p-side barrier layers.

In at least one embodiment of the component, the latter comprises a semiconductor layer sequence. The semiconductor layer sequence contains a p-conductive semiconductor layer, an n-conductive semiconductor layer and an active zone arranged between the p-conductive semiconductor layer and the n-conductive semiconductor layer. In this respect, the active zone comprises a multiple quantum well structure which, from the p-conductive semiconductor layer to the n-conductive semiconductor layer, comprises at least one p-side barrier layer or a plurality of p-side barrier layers in particular with intermediate quantum well layers and a plurality of n-side barrier layers in particular with intermediate quantum layers. In the semiconductor layer sequence on the side of the p-conductive semiconductor layer, recesses are formed which have sidewalls, wherein the quantum well layers and/or the n- and p-side barrier layers extend at least in places conformally with the sidewalls of the recesses. The n-side barrier layers have a greater average layer thickness than the p-side barrier layers.

Such a configuration of the semiconductor layer sequence ensures uniform distribution of the charge carriers over the quantum well layers due to a combination of two different injection mechanisms, namely injection of the charge carriers via the barrier layers between the quantum well layers (barrier injection) and injection of the charge carriers via the recess (V-pit injection) in particular into the quantum well layers further away from the p-conductive semiconductor layer, for instance into the quantum well layers arranged between the n-side barrier layers. The injection of holes into the quantum well layers is in particular promoted due to both two stated mechanisms, owing to the recess in the active zone and owing to the comparatively thinner p-side barrier layers. Overall, the efficiency of the component is increased by the configuration of the active zone with at least one or with a plurality of recesses or with barrier layers of different thicknesses. The comparatively thicker n-side barrier layers moreover contribute to the achievement of high material quality and to high stability of the semiconductor layer sequence in particular during production thereof.

According to at least one embodiment of the component, the semiconductor layer sequence is configured in such a way that the sidewalls of the recesses are oblique and the p-side barrier layers have smaller layer thicknesses than the n-side barrier layers, whereby, when the component is in operation, charge carriers are injected from the p-conductive semiconductor layer both throughout the barrier layers extending along the sidewalls and throughout the barrier layers located outside the recesses into different quantum well layers. That is to say, when the component is in operation, the positively charged charge carriers are injected into different quantum well layers by means of a combination of barrier injection outside the recesses and V-pit injection inside the recesses.

According to at least one configuration of the semiconductor layer sequence, the recesses extend into the active zone for example at least up to a vertical height of the n-side barrier layers or into the n-side barrier layers, such that the charge carriers from the p-conductive semiconductor layer are injected via the obliquely configured sidewalls of the recesses predominantly, i.e. to an extent greater than 50%, for example greater than 70% or greater than 80% of the total charge carriers from the p-conductive semiconductor layer, into the quantum well layers arranged between the n-side barrier layers. The sidewalls of the recesses may in this respect form an acute angle of between 15° and 80° inclusive, for instance between 20° and 60° inclusive, with a vertically directed axis for example parallel to the direction of growth.

According to at least one embodiment of the component, the p-side barrier layers each have a layer thickness of between 2 nm and 15 nm inclusive, for example between 3 nm and 10 nm inclusive, for instance between 3 nm and 7 nm inclusive. The n-side barrier layers may in this respect each have a layer thickness of between 5 nm and 50 nm inclusive, for example between 5 nm and 30 nm inclusive, for instance between 10 nm and 30 nm. Preferably, the p-side barrier layers each have a layer thickness of between 3 nm and 7 nm inclusive and the n-side barrier layers each have a greater layer thickness of between 4.5 nm and 30 nm inclusive since, with this selection of layer thicknesses in particular, a high semiconductor layer sequence material quality and a particularly uniform distribution of the charge carriers in the active zone may be simultaneously achieved.

According to at least one embodiment of the component, at least one of the n-side barrier layers has a layer thickness which is greater than a layer thickness of the respective barrier layers which are arranged between this n-side barrier layer and the p-conductive semiconductor layer. All the n-side barrier layers may also each have a layer thickness which is greater than a layer thickness of the respective p-side barrier layers. The n-side barrier layers may have the same layer thickness, within the bounds of manufacturing tolerances. The p-side barrier layers may also have the same layer thickness, within the bounds of manufacturing tolerances.

According to at least one embodiment of the component, the active zone comprises at least three n-side barrier layers and at least one p-side barrier layer. The number of p-side barrier layers may in this respect amount to at least three. The number of quantum well layers may in this respect be between five and 20 inclusive, for instance between 6 and 15 inclusive. For example, the number of quantum well layers on the p-side of the active zone is smaller than the number of quantum well layers on the n-side of the active zone.

According to at least one configuration of the component, the barrier layers have layer thicknesses that increase monotonically at least in places from the p-conductive semiconductor layer to the n-conductive semiconductor layer. In other words, the active zone has a gradient, at least in places, with regard to layer thicknesses, with the layer thickness of the barrier layers increasing from the p-side to the n-side. The active zone may for example have such a gradient with regard to the layer thickness of the barrier layers over the entire multiple quantum well structure.

According to at least one embodiment of the component, the recess is of V-shaped configuration in sectional view. The recess thus has a cross-section which decreases from the p-side to the n-side of the active zone. In particular, the recess takes the form of an inverted pyramid, for example with six or twelve sidewalls, an inverted truncated pyramid, or an inverted cone or truncated cone. In particular, the recess is formed by a V-defect, or V-pit. Such a V-defect may be produced in a semiconductor layer, for instance in a gallium nitride or indium gallium nitride layer, by adjusting the growth parameters. The size of the V-defect then depends on the layer thickness of the semiconductor layer in which it is produced. In particular, the V-defects form in the region of threading dislocations in the semiconductor layer.

According to at least one embodiment of the component, a plurality of quantum well layers follow the shape of the recesses. In other words, the quantum well layers may at least in places extend conformally with the sidewalls of the recesses. In regions of the recesses, these quantum well layers may in each case be continuous or interrupted. Preferably, the recesses each have obliquely configured sidewalls, via which the charge carriers may be injected from the p-conductive semiconductor layer into different quantum well layers, in particular arranged between the n-side barrier layers. Preferably, all the quantum well layers and/or all the barrier layers on the p-side of the active zone follow the shape of the recess, whereby the positively charged charge carriers may be efficiently injected via the sidewalls of the recess into the quantum well layers on the n-side.

According to at least one embodiment of the component, the quantum well layers have different layer thicknesses in a lateral direction. In particular, the quantum well layers have smaller layer thicknesses in regions inside the recesses compared to regions outside the recesses. The barrier layers may likewise have smaller layer thicknesses in regions inside the recesses. As a result of the smaller layer thicknesses in the regions inside the recesses, the charge carriers, for example the holes, may be injected with a higher probability into different quantum well layers, in particular located on the n-side.

According to at least one embodiment of the component, the active zone is based on a compound semiconductor material, for instance gallium nitride. The barrier layers are for example GaN layers and the quantum well layers InGaN layers. It is also possible for the barrier layers to comprise indium, wherein an indium content of the barrier layers is preferably less than an indium content of the quantum well layers. In the lateral direction the quantum well layers may have a varying indium profile. For example, the quantum well layers may have a lower indium content in the regions inside the recess compared to the regions outside the recess. The barrier layers may comprise aluminum, wherein the aluminum content may vary in the various barrier layers. It is also possible for the aluminum profile within a barrier layer to vary in a vertical or lateral direction. In particular, the active zone is configured such that the injection of holes from the p-side of the active zone into the quantum well layers is promoted by varying the indium content and/or the aluminum content within one barrier layer and/or in different barrier layers.

According to at least one embodiment of the component, the quantum well layers are adapted to the barrier layers in that the quantum well layers, which adjoin barrier layers of different thicknesses, comprise different material compositions, layer thicknesses, indium contents and/or different doping profiles. To achieve a uniform distribution of the charge carriers, in particular the holes, over the quantum well layers, the n-side barrier layers and/or the p-side barrier layers may likewise be differently configured with regard to their material composition, layer thicknesses or doping profiles.

According to at least one embodiment of the component, the semiconductor layer sequence comprises a superlattice structure. The superlattice structure is arranged between the active zone and the n-conductive or p-conductive semiconductor layer and preferably adjoins the active zone. The superlattice structure may comprise a plurality of pairs of alternating semiconductor thin film layers. The semiconductor thin film layers are for example InGaN layers and GaN layers. The thin film semiconductor layers are thus arranged outside the active zone, wherein they may each have a smaller layer thickness than the barrier layers of the active zone. The semiconductor thin film layers may in this respect be n-conductively or p-conductively doped. By means of the superlattice structure, a particularly low forward voltage of the component is achieved, whereby good charge carrier injection into the active zone may be achieved.

Further advantages, preferred embodiments and further developments of the component are revealed by the exemplary embodiments explained hereinafter in conjunction with FIGS. 1 to 5, in which.

Identical, similar or identically acting elements are provided with identical reference numerals in the figures. The figures are in each case schematic representations and are therefore not necessarily true to scale. Rather, comparatively small elements and in particular layer thicknesses may be illustrated on an exaggeratedly large scale for clarification.

Figure 1:
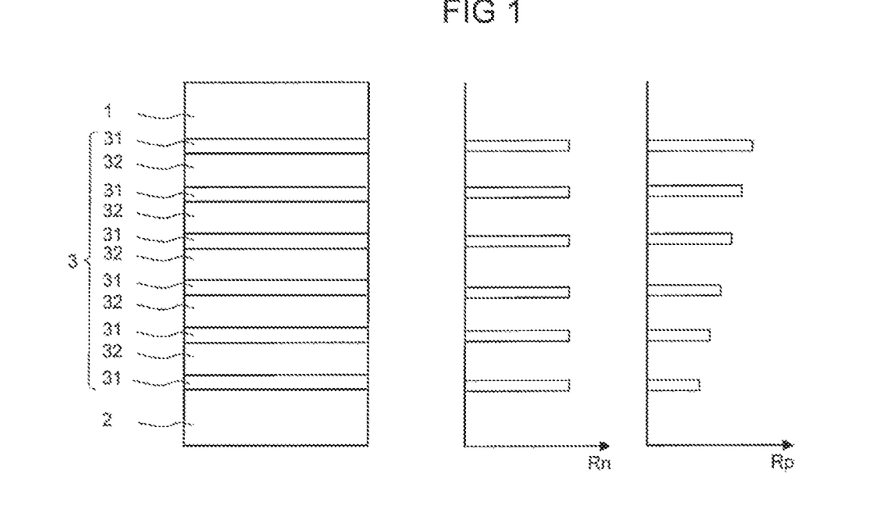
FIG. 1 is a schematic diagram of a semiconductor layer sequence of a known component.

FIG. 1 shows a component known from the prior art. This component comprises a first semiconductor layer 1, a second semiconductor layer 2 and an active zone 3 arranged between the first semiconductor layer 1 and the second semiconductor layer 2 and having a plurality of barrier layers 32 and quantum well layers 31. The first semiconductor layer 1 and the second semiconductor layer 2 are p- and n-conductive respectively. Charge carriers, namely holes from the first semiconductor layer 1 and electrons from the second semiconductor layer 2, are injected into the active zone 3. Owing to the different passage probabilities of the holes and electrons at the barrier layers, the charge carriers are not uniformly distributed over the quantum well layers in the active zone, so limiting the efficiency of the component. While the density of the electrons Rn remains substantially the same over the entire active zone, the density of the holes Rp normally decreases as the number or the overall layer thickness of the barrier layers increases.

Figure 2:
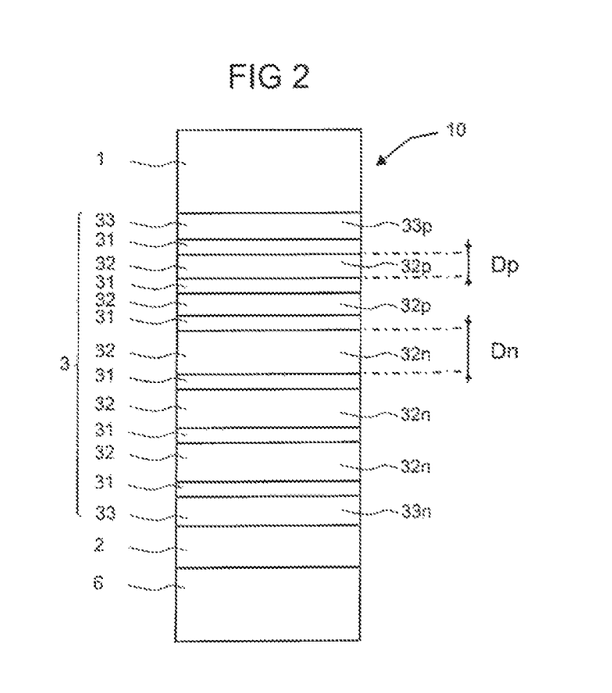
FIG. 2 is a schematic representation of an exemplary embodiment of a component.

FIG. 2 is a diagrammatic representation of a first exemplary embodiment of a component 10.

The component 10 comprises a carrier 6, on which a semiconductor layer sequence is arranged. The carrier 6 may be a growth substrate, to which the semiconductor layer sequence has for example been epitaxially applied. The semiconductor layer sequence comprises an active zone 3, which is arranged between a first, for instance p-conductive semiconductor layer 1, and a second, for instance n-conductive semiconductor layer 2. The active zone 3 is in particular configured to generate electromagnetic radiation when the component 10 is in operation.

The active zone 3 comprises a multiple quantum well structure with successive quantum well layers 31 and barrier layers 32. The barrier layers 32 are classified as n-side barrier layers 32n and p-side barrier layers 32p. The p-side barrier layers 32p are arranged between the n-side barrier layers 32n and the p-conductive semiconductor layer 1 and thus on a p-side of the active zone 3. The n-side barrier layers 32n are accordingly arranged between the p-side barrier layers 32p and the n-conductive semiconductor layer 2 and thus on an n-side of the active zone 3. For example, around a tenth or a third or half of the barrier layers 32 are arranged on the n-side or on the p-side of the active zone 3.

In FIG. 2 the multiple quantum well structure 3 comprises peripheral terminating barriers 33, namely a p-side terminating barrier 33p and an n-side terminating barrier 33n. The terminating barriers 33p and 33n for example adjoin the p-conductive semiconductor layer 1 and the n-conductive semiconductor layer 2, respectively. In particular, the terminating barriers 33 delimit the multiple quantum well structure 3 in the vertical direction.

The n-side barrier layers 32n and the p-side barrier layers 32p in this respect have different layer thicknesses Dn and Dp. The n-side barrier layers preferably have a greater average layer thickness than the p-side barrier layers. The comparatively thinner barrier layers 32 on the p-side of the active zone 3 allow good barrier injection of the holes to be achieved at least into the quantum well layers 31 located on the p-side. The barrier layers 32 and the quantum well layers 31 may for example be applied by means of an epitaxial method onto the carrier 6, a growth direction being directed in particular from the n-side to the p-side. The comparatively thicker n-side barrier layers allow a high material quality to be achieved for the semiconductor layer sequence. The thicker barrier layers 32n applied first thus contribute to an increase in the mechanical stability of the semiconductor layer sequence even during manufacture.

The average layer thickness of the n-side barrier layers 32n is for example at least 20%, for instance at least 50% or at least two or three times greater than the average layer thickness of the p-side barrier layers 32p. In particular, all the n-side barrier layers 32n may each have a layer thickness Dn which is greater than a vertical thickness Dp of any desired p-side barrier layer 32p.

The n-side barrier layers 32n depicted in FIG. 2 have a substantially identical vertical layer thickness Dn. The p-side barrier layers 32p may in this respect likewise have a substantially identical layer thickness Dp. In variation fro, this, the layer thicknesses Dn and Dp of the various n-side barrier layers 32n or of the various p-side barrier layers 32p may be of different sizes. The vertical layer thickness Dp may be between 2 and 15 nm inclusive, for example between 3 and 10 nm inclusive, for instance between 3 and 7 nm inclusive. The vertical layer thickness Dn is preferably greater than the layer thickness Dp and may be between 5 nm and 50 nm inclusive, for example between 5 nm and 30 nm inclusive, for instance between 10 nm and 30 nm. The p-side terminating barrier 33p may in this respect have a greater layer thickness than the p-side barrier layers 32p. The n-side terminating barrier 33n may have a smaller layer thickness than the n-side barrier layers 32n.

The active zone 3 according to FIG. 2 comprises two p-side barrier layers 32p and three n-side barrier layers 32n. In variation from this, the active zone 3 may comprise a greater number of p-side barrier layers 32p or n-side barrier layers 32n. For example, the active zone 3 comprises at least two, for instance at least four or at least five, quantum well layers 31 on the p-side and at least two, for instance at least five or at least ten, quantum well layers 31 on the n-side. The quantum well layers 31 and the barrier layers 32 may be based on a III-V compound semiconductor material, for instance on gallium nitride. For example, the quantum well layers are indium gallium nitride layers and the barrier layers are gallium nitride layers. The quantum well layers 31 and the barrier layers 32 may in this respect be doped or undoped. Furthermore, the active zone 3 may contain indium or aluminum, wherein the indium content and the aluminum content in the quantum well layers 31 and in the barrier layers 32 may differ from each other.

At variance with FIG. 2, the n-side barrier layers 32n and/or the p-side barrier layers 32p may be differently configured with regard to their layer thicknesses. The barrier layers 32 may moreover differ from one another with regard to their material composition and/or doping profile. In particular, the active zone 3 may be configured such that the quantum well layers 31 which adjoin barrier layers 32 with different layer thicknesses are differently configured with regard to their material composition, layer thicknesses or doping profile, such that the quantum well layers 31 are conformed to the barrier layers 32 to achieve uniform distribution of the charge carriers. It is also possible for the doping profile, indium content and/or aluminum content within one barrier layer to vary.

Figure 3:
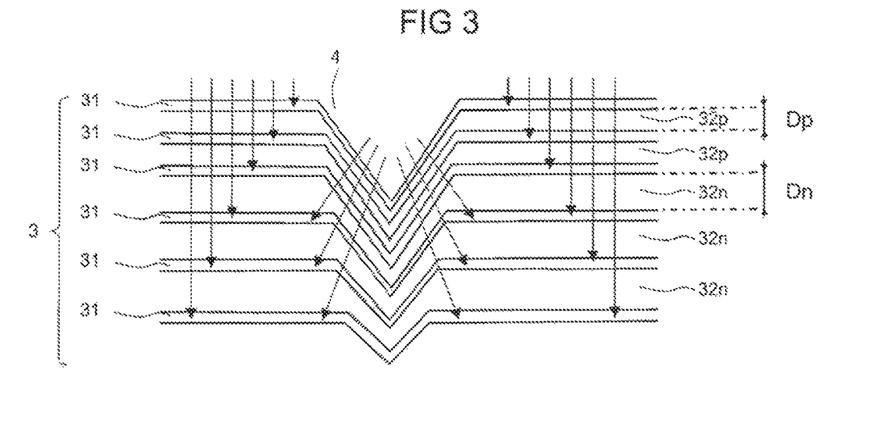
FIGS. 3 and 4 are schematic representations of exemplary embodiments of an active zone of a component.

FIG. 3 shows a further portion of the active zone 3 depicted in FIG. 2. The active zone 3 comprises a recess 4 on the p-side. In sectional view the recess 4 is V-shaped. The V-shaped recess 4 in particular has, in relation to the p-conductive semiconductor layer 1, the shape of an inverted pyramid with for example six or twelve differently oriented sidewalls. The recess 4 has a cross-section which decreases from the p-side to the n-side, such that the sidewalls of the recess 4 are oblique relative to the main area of extension of the active zone 3. For example, the sidewalls of the recess form an acute angle of between 20° and 80° inclusive, for instance between 30° and 60° inclusive, with an axis directed perpendicular to the main area of extension. Positively charged charge carriers from the p-conductive semiconductor layer 1, namely the holes, may be effectively injected via the obliquely configured sidewalls of the recess 4 into different quantum well layers 31 on the n-side.

The recess 4 has a vertical depth T which is for example greater than the layer thickness Dp of the p-side barrier layer 32p, for instance at least two, three or five times as great as the layer thickness Dp of the p-side barrier layer 32p. In particular, the depth T of the recess 4 may be greater than the sum of all the layer thicknesses Dp of the p-side barrier layers 32p.

In FIG. 3, the quantum well layers 31 and the barrier layers 32 follow the recess 4 at least in places. That is to say, the quantum well layers 31 and the barrier layers 32 in places likewise adopt the shape of the recess 4. In particular, all the p-side barrier layers 32p follow the shape of the recess 4. All the barrier layers 32 and/or all the quantum well layers 31 also in places adopt the shape of the recess.

With the recess 4 and the different layer thicknesses Dp and Dn of the barrier layers 32, the active zone 3 is configured such that a combination of two different injection mechanisms is achieved thereby, namely a combination of barrier injection of the holes in particular into all the quantum well layers 31 and V-pit injection of the holes in particular predominantly into the quantum well layers 31 on the n-side. The quantum well layers 31 on the n-side, which for example adjoin the comparatively thicker n-side barrier layers 32n, are thus not only energized by way of the barrier injection, but also by way of the V-pit injection, such that particularly uniform charge carrier distribution is achieved, in particular with regard to the holes, over the entire active zone 3. The arrows depicted in FIG. 3 indicate the injection of holes into the various quantum well layers 31.

The active zone 3 is provided in particular for generating electromagnetic radiation when the component is in operation.

The holes guided via the p-conductive semiconductor layer 1 into the active zone 3 and the electrons guided via the n-conductive semiconductor layer 2 into the active zone 3 may recombine in the quantum well layers 31 with generation of radiation. In FIG. 3, the quantum well layers 31 are configured to be continuous in the regions of the recess 4. It is therefore also possible for electromagnetic radiation to be generated in the regions of the recess 4.

At variance with FIG. 3, it is also possible to configure the active zone 3 in such a way that the quantum well layers 31 are interrupted in the regions of the recess 4. It is alternatively also possible to configure the active zone 3 in such a way, through different configuration of the quantum well layers 31 and/or of the barrier layers 32 with regard to material composition, layer thicknesses or doping profiles in the regions of the recess, that recombination of holes and electrons is hindered in the regions of the recess 4 and the holes are in this way injected efficiently via the sidewalls of the recess 4 into different quantum well layers 31 on the n-side. The quantum well layers 31 may for example have a lower indium content and/or smaller layer thickness in the regions inside the recess 4 compared to regions outside the recess 4. In comparison with the regions outside the recess, the barrier layers 32 in the regions inside the recess 4 may likewise have a smaller layer thickness.

Figure 4:
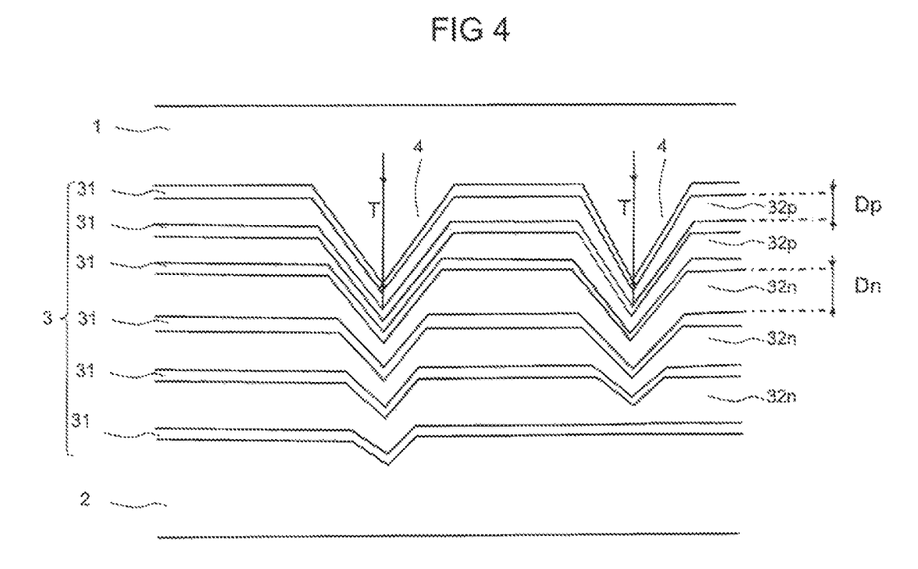

The exemplary embodiment depicted in FIG. 4 substantially corresponds to the exemplary embodiment depicted in FIG. 3. At variance therewith, the active zone 3 comprises a plurality of recesses 4. The recesses 4 may have different vertical depths T. It is also possible, as shown in FIG. 4, for not all the barrier layers 32 and quantum well layers 31, in particular the barrier and quantum well layers on the n-side, to follow the shape of the recess 4. In FIG. 4 the p-conductive semiconductor layer 1 extends into the recesses 4. The n-conductive semiconductor layer 2 may exhibit the shape of the recess 4 in places. The p-conductive semiconductor layer 1 and the n-conductive semiconductor layer 2 may respectively be doped or undoped.

Figure 5:
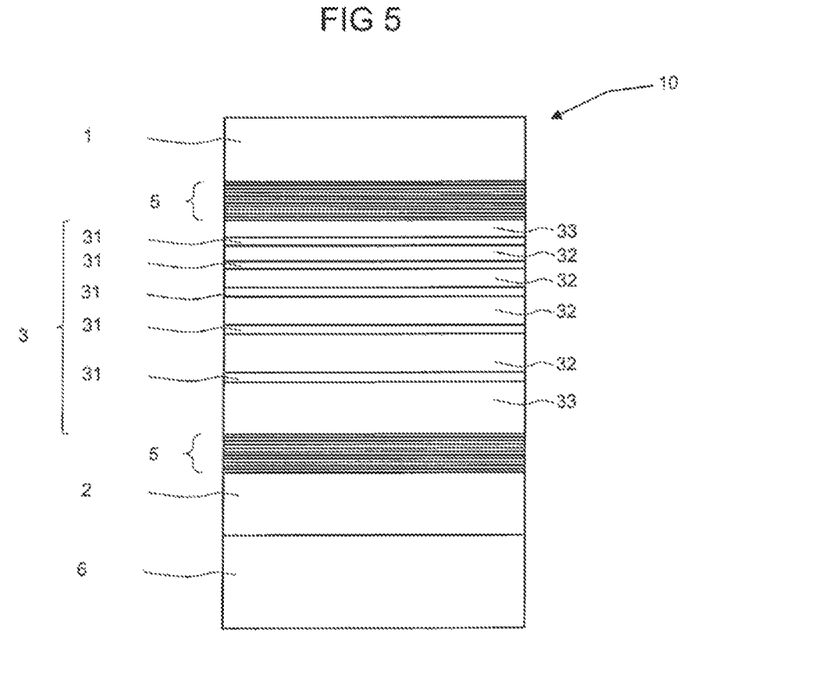
FIG. 5 is a schematic representation of a further exemplary embodiment of a component.

The exemplary embodiment shown in FIG. 5 corresponds substantially to the exemplary embodiment of a component shown in FIG. 2. At variance therewith, the barrier layers 32 have layer thicknesses increasing monotonically from the p-conductive semiconductor layer 1 to the n-conductive semiconductor layer 2, i.e. from the p-side to the n-side. In contrast thereto, it is also possible for the active zone 3 to have barrier layers 32 with layer thicknesses which increase monotonically from the p-side to the n-side only in places. Furthermore, the component 10 shown in FIG. 5 comprises a superlattice structure 5. The superlattice structure 5 in particular contains a plurality of alternating semiconductor thin film layers, which may in each case have a smaller layer thickness than the barrier layers 32. In particular, the superlattice structure adjoins the active zone 3. The superlattice structure 5 may be arranged between the n-conductive semiconductor layer 2 and the active zone 3 or between the p-conductive semiconductor layer 1 and the active zone 3. The injection of charge carriers into the active zone 3 is promoted by means of the superlattice structure 5. In FIG. 5 the component 10 comprises two superlattice structures 5, which respectively adjoin the n-side, for instance the n-side terminating barrier 33*n*, or the p-side, for instance the p-side terminating barrier 33*p* of the multiple quantum well structure 3 of the active zone 3.

This patent application claims priority from German patent application 10 2015 104 150.2, the disclosure content of which is hereby included by reference.

The description of the invention made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A component having a semiconductor layer sequence comprising a p-conductive semiconductor layer, an n-conductive semiconductor layer and an active zone arranged between the p-conductive semiconductor layer and the n-conductive semiconductor layer, wherein the active zone comprises a multiple quantum well structure, which, from the p-conductive semiconductor layer towards the n-conductive semiconductor layer, comprises a plurality of p-side barrier layers with intermediate quantum well layers and a plurality of n-side barrier layers with intermediate quantum layers, in the semiconductor layer sequence on the side of the p-conductive semiconductor layer, recesses are formed which have sidewalls, wherein the quantum well layers and/or the plurality of n- and p-side barrier layers extend at least in places conformally with the sidewalls of the recesses, the plurality of the n- and p-side barrier layers have layer thicknesses that increase monotonically from the p-conductive semiconductor layer towards the n-conductive semiconductor layer, such that the active zone has a gradient with increasing layer thickness of the barrier layers towards the n-conductive semiconductor layer, and the n-side barrier layers have a greater average layer thickness than the p-side barrier layers.

2. The component according to claim 1, wherein the semiconductor layer sequence is configured in such a way that the sidewalls of the recesses are oblique and the p-side barrier layers have smaller layer thicknesses than the n-side barrier layers, whereby, when the component is in operation, charge carriers are injected from the p-conductive semiconductor layer both throughout the barrier layers extending along the sidewalls and throughout the barrier layers located outside the recesses into different quantum well layers.

3. The component according to claim 2, wherein the recesses extend at least up to a vertical height of the n-side barrier layers, such that the charge carriers from the p-conductive semiconductor layer are injected via the obliquely configured sidewalls of the recesses predominantly into the quantum well layers arranged between the n-side barrier layers.

4. The component according to claim 1, wherein the recesses are of V-shaped configuration in sectional view.

5. The component according to claim 1, wherein the average layer thickness of the n-side barrier layers is at least 1.2 times and at most 10 times the average layer thickness of the p-side barrier layers.

6. The component according to claim 1, wherein the p-side barrier layers each have a layer thickness of between 3 nm and 7 nm inclusive and the n-side barrier layers each have a layer thickness of between 5 nm and 30 nm inclusive.

7. The component according to claim 1, wherein all the n-side barrier layers each have a layer thickness which is greater than a layer thickness of the respective p-side barrier layers.

8. The component according to claim 1, wherein the barrier layers have layer thicknesses that increase monotonically at least in places from the p-conductive semiconductor layer towards the n-conductive semiconductor layer.

9. The component according to claim 1, wherein the quantum well layers and/or at least the p-side barrier layers have smaller layer thicknesses in regions inside the recesses compared to regions outside the recesses.

10. The component according to claim 1, wherein the n-side barrier layers and/or the p-side barrier layers are differently configured with regard to their material composition, layer thicknesses or doping profiles.

11. The component according to claim 1, wherein the quantum well layers which adjoin the barrier layers with different layer thicknesses are differently configured with regard to their material composition, layer thicknesses or doping profile.

12. The component according to claim 1, wherein the semiconductor layer sequence comprises at least one superlattice structure made of a plurality of semiconductor thin film layers, wherein the superlattice structure adjoins the active zone.

13. The component according to claim 1, wherein the active zone is based on a III-V compound semiconductor material.

14. The component according to claim 13, wherein the quantum well layers have a lower indium content in regions inside the recesses compared to regions outside the recesses.

15. The component according to claim 1, wherein the active zone is configured to generate electromagnetic radiation when the component is in operation.

16. The component according to claim 1, wherein
the barrier layers are those layers of the multiple quantum well structure which are each arranged between two quantum well layers of the multiple quantum well structure and adjoin these quantum well layers associated therewith,
the multiple quantum well structure comprises a p-side terminating barrier, said p-side terminating barrier having a greater layer thickness than the p-side barrier layers, and
a peripheral quantum well layer is arranged between one of barrier layers and the p-side terminating barrier.

17. The component according to claim 1, wherein the active zone has the gradient with regard to the layer thickness of the barrier layers over the entire multiple quantum well structure.

18. A component having a semiconductor layer sequence comprising a p-conductive semiconductor layer, an n-conductive semiconductor layer and an active zone arranged between the p-conductive semiconductor layer and the n-conductive semiconductor layer, wherein
the active zone comprises a multiple quantum well structure, which, from the p-conductive semiconductor layer towards the n-conductive semiconductor layer, comprises a plurality of p-side barrier layers with intermediate quantum well layers and a plurality of n-side barrier layers with intermediate quantum layers,
in the semiconductor layer sequence on the side of the p-conductive semiconductor layer, recesses are formed which have sidewalls, wherein the quantum well layers and/or the n- and p-side barrier layers extend at least in places conformally with the sidewalls of the recesses,
the n-side barrier layers have a greater average layer thickness than the p-side barrier layers,
the barrier layers are those layers of the multiple quantum well structure which are each arranged between two quantum well layers of the multiple quantum well structure and adjoin these quantum well layers associated therewith,
the multiple quantum well structure comprises a p-side terminating barrier, said p-side terminating barrier having a greater layer thickness than the p-side barrier layers, and
the barrier layers have layer thicknesses that increase monotonically at least in places from the p-conductive semiconductor layer towards the n-conductive semiconductor layer, such that the active zone has a gradient with increasing layer thickness of the barrier layers towards the n-conductive semiconductor layer.

* * * * *